United States Patent
Hatem et al.

(10) Patent No.: US 8,101,528 B2
(45) Date of Patent: Jan. 24, 2012

(54) LOW TEMPERATURE ION IMPLANTATION

(75) Inventors: Christopher R. Hatem, Salisbury, MA (US); Benjamin Colombeau, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/850,317

(22) Filed: Aug. 4, 2010

(65) Prior Publication Data

US 2011/0034013 A1    Feb. 10, 2011

Related U.S. Application Data

(60) Provisional application No. 61/232,218, filed on Aug. 7, 2009.

(51) Int. Cl.
*H01L 21/31* (2006.01)

(52) U.S. Cl. ........ 438/766; 438/302; 438/369; 438/480; 438/505

(58) Field of Classification Search .......... 438/302–307, 438/369–373, 480, 505–506, 514–519, 527, 438/766
See application file for complete search history.

(56) References Cited

U.S. PATENT DOCUMENTS

| | | | |
|---|---|---|---|
| 5,244,820 A | 9/1993 | Kamata et al. | |
| 5,399,506 A * | 3/1995 | Tsukamoto | 438/301 |
| 6,214,707 B1 * | 4/2001 | Thakur et al. | 438/513 |
| 6,475,815 B1 | 11/2002 | Nambu et al. | |
| 2003/0087504 A1 * | 5/2003 | Erokhin et al. | 438/407 |
| 2007/0212861 A1 | 9/2007 | Chidambarrao | |
| 2008/0318387 A1 | 12/2008 | Jain | |

FOREIGN PATENT DOCUMENTS

| | | |
|---|---|---|
| WO | 2008020972 A2 | 2/2008 |
| WO | 2008042647 A2 | 4/2008 |
| WO | 2010051269 A2 | 5/2010 |

OTHER PUBLICATIONS

S.N. Hsu et al., Effects of Substrate Temperature on the Annealing Behavior of Residual Defects in High-Dose As+ implanted (001) Si, Nuclear Inst. & Methods in Phys. Res., 1991, pp. 1037-1040, B59-60.

* cited by examiner

*Primary Examiner* — Dung A. Le

(57) ABSTRACT

A method of processing to a substrate while minimizing cost and manufacturing time is disclosed. The implantation of the source and drain regions of a semiconductor device are performed at low temperatures, such as below 273° K. This low temperature implant reduces the structural damage caused by the impacting ions. Subsequently, the implanted substrate is activated using faster forms of annealing. By performing the implant at low temperatures, the damage to the substrate is reduced, thereby allowing a fast anneal to be used to activate the dopants, while eliminating the majority of the defects and damage. Fast annealing is less expensive than conventional furnace annealing, and can achieve higher throughput at lower costs.

12 Claims, 6 Drawing Sheets

LOW TEMPERATURE ION IMPLANTATION

This application claims priority of U.S. Provisional Patent Application Ser. No. 61/232,218, filed Aug. 7, 2009, the disclosure of which is incorporated herein in its entirety.

FIELD

The present disclosure relates generally to semiconductor manufacturing and, more particularly, to techniques for low-temperature ion implantation.

BACKGROUND

Ion implantation is one of several processes performed for manufacturing semiconductor devices. One such semiconductor device may be a complementary metal-oxide-semiconductor (CMOS) device. In manufacturing the device, portions of a semiconductor substrate are implanted with dopants. Generally, dopants may be atoms or molecules with properties that differ from those of the original substrate. Once implanted, the dopants may alter the properties of the implanted regions such that the resulting substrate may have discrete regions with different properties. In addition to the implanted dopants, discrete regions with different properties in the substrate may form by ion implantation as the implantation induces defects.

One method of introducing dopants into a semiconductor substrate is through the use of an ion implanter. An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

With continued miniaturization of semiconductor devices, there has been an increased demand to form smaller regions having more abrupt junctions. For example, tremendous effort has been devoted to creating better activated, shallower, and more abrupt source-drain extension via ion implantation. To create an abrupt, ultra-shallow junction in a crystalline silicon wafer, for example, amorphization of the wafer surface is desirable. Generally, a relatively thick amorphous silicon layer is preferred because fewer interstitials from the ion implant will remain after a solid-phase epitaxial growth as part of a post-implant anneal. A thin amorphous layer can lead to more interstitials residing in an end-of-range area beyond the amorphous-crystalline interface. These interstitials may lead to transient enhanced diffusion (TED) of ion-implanted dopants, causing a resultant dopant profile (e.g., P-N or N-P junction) to deepen and/or lose a desired abruptness. As a result, a thinner amorphous layer can adversely increase short channel effects in electronic devices. The interstitials may also lead to the formation of inactive clusters which, particularly in the case of boron, can reduce dopant activation. The interstitials beyond the amorphous-crystalline interface that are not removed during the activation anneal may combine to form complex end-of-range damage. This damage can lead to junction leakage and yield loss mechanisms. The damage may evolve during later thermal processes by emitting interstitials which can lead to further dopant diffusion and dopant deactivation.

In view of the foregoing, it would be desirable to provide a solution which overcomes the above-described inadequacies and shortcomings.

SUMMARY

A method of processing to a substrate while minimizing cost and manufacturing time is disclosed. The implantation of the source and drain regions of a semiconductor device are performed at low temperatures, such as below 273° K. This low temperature implant reduces the structural damage caused by the impacting ions. Subsequently, the implanted substrate is activated using fast forms of annealing. By performing the implant at low temperatures, the damage to the substrate is reduced, thereby allowing a fast anneal to be used to activate the dopants, while eliminating the majority of the defects and damage. Faster forms of annealing are less expensive than conventional furnace annealing, and can achieve higher throughput at lower costs.

BRIEF DESCRIPTION OF THE DRAWINGS

For a better understanding of the present disclosure, reference is made to the accompanying drawings, which are incorporated herein by reference and in which.

DETAILED DESCRIPTION

To solve the aforementioned problems, several embodiments of techniques for low-temperature ion implantation are introduced. For purpose of clarity and simplicity, the present disclosure focuses in a beam-line ion implantation system. However, those skilled in the art will recognize that the present disclosure may be equally applicable to other systems including a plasma assisted doping (PLAD) system or a plasma immersion ion implantation (PIII) system.

In addition, the present disclosure focuses on performing the low temperature ion implantation on a silicon wafer for manufacturing semiconductor devices. However, those of ordinary skill in the art will recognize that the present disclosure may be equally applicable to other types of substrates including other types of semiconductor substrates, metallic substrates, insulating substrates, and a combination thereof.

Figure 6:
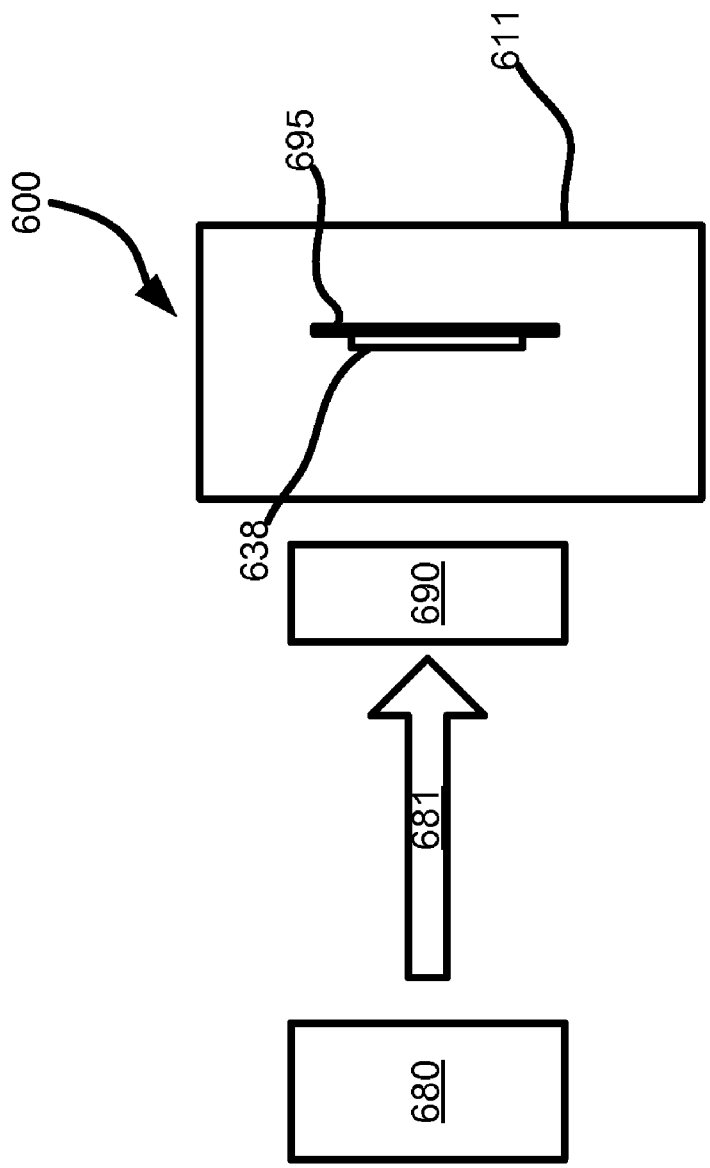
FIG. 6 is a simplified block diagram of a beam-line ion implanter.

FIG. 6 is a simplified block diagram of a beam-line ion implanter. Those skilled in the art will recognize that the beamline ion implanter 600 is only one of many examples of differing beamline ion implanters. In general, the beamline ion implanter 600 includes an ion source 680 to generate ions that are extracted to form an ion beam 681, which may be, for example, a ribbon beam or a spot beam. The ion beam 681 may be mass analyzed and converted from a diverging ion beam to a ribbon ion beam with substantially parallel ion trajectories in one instance. The beamline ion implanter 600 may further include an acceleration or deceleration unit 690 in some embodiments.

An end station 611 supports one or more workpieces, such as substrate 638, in the path of the ion beam 681 such that ions of the desired species are implanted into substrate 638. In one instance, the substrate 638 may be a semiconductor wafer having a disk shape, such as, in one embodiment, a 300 mm diameter silicon wafer. However, the substrate 638 is not limited to a silicon wafer. The substrate 638 could also be, for example, a flat panel, solar, or polymer substrate. The end station 611 may include a platen 695 to support the substrate 638. The end station 611 also may include a scanner (not shown) for moving the substrate 638 perpendicular to the long dimension of the ion beam 681 cross-section, thereby distributing ions over the entire surface of substrate 638.

The ion implanter 600 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 600 may incorporate hot or cold implantation of ions in some embodiments.

Figure 1:
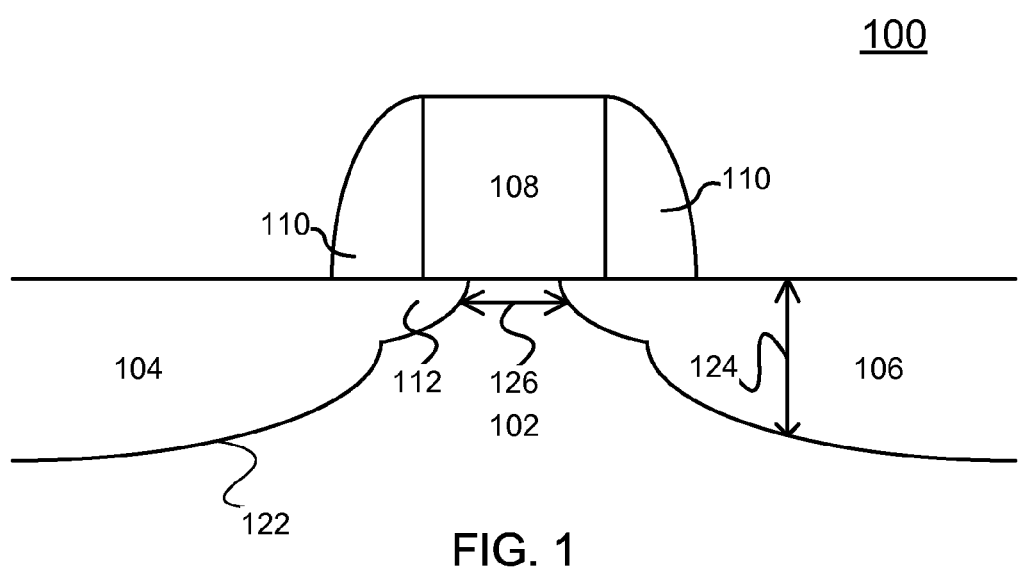
FIG. 1 is a cross-sectional view of a typical transistor.

Referring to FIG. 1, there is shown an exemplary MOS device 100 that may be manufactured via a low-temperature ion implantation according to one embodiment of the present disclosure. The device 100 may comprise a source 104, a drain 106, and a source/drain channel 126 formed in a, preferably, pre-doped silicon substrate 102. The device 100 may also comprise a gate 108 and spacers 110 formed on the substrate 102. Further, the device 100 may comprise source/drain extensions 112 and channel 126. As known in the art, the conductivity of substrate 102 may be opposite to the conductivity of each of the source 104, drain 106, and source/drain extension 112. Accordingly, a junction 122 may be formed between the substrate 102 and each of the source 104, the drain 106, and the source/drain extension 112.

As noted above, ion implantation may be used to form the device 100. In particular, ion implantation may be used to form the source 104, the drain 106, and the source/drain extension regions 112. Generally, the substrate 102 may be pre-doped with p-type or n-type dopants. For n-MOS device, the substrate 102 may be pre-doped with p-type dopants, whereas the substrate 102 may be pre-doped with n-type dopants for p-MOS devices. After pre-doping the substrate 102, the substrate 102 is disposed in an ion implanter, where the substrate can be doped to form the source 104 region, the drain 106 region, and the extension 112 regions.

Various types of dopants may be used to form the source 104 region, the drain 106 region, and the extension 112 regions. For n-MOS, n-type dopants may be used. For example, atomic or molecular ions containing Group V elements, such as phosphorous, may be prepared in an ion source of the ion implanter and implanted into the substrate 102. Alternatively, other types of n-type dopants containing arsenic, selenium, or tellurium, or any other atomic or molecular n-type dopants may be used. For p-MOS, p-type dopants may be used. Examples of p-type dopants may include atomic or molecular ions containing Group III elements, such as boron.

As noted above, the ion implantation process may be performed to form the source 104, the drain 106, and the source/drain extension regions 112. However, unlike the conventional process, the ion implantation process of the present embodiment is performed at a low temperature. For example, the substrate 102 is maintained at a low temperature during ion implantation to form the source 104, the drain 106, and/or the source/drain extension regions 112. The substrate 102 may also be maintained at a low temperature during ion implantation to form other parts of the device 100 or to process other parts of the device 100. The substrate 100, during the ion implantation, may be maintained at 273° K or below. Throughout this disclosure, the term "low temperature" refers to temperatures at or below 273° K, such as between 173° K and 273° K.

A low temperature ion implantation provides various benefits. Those of ordinary skill in the art will recognize that an ion implantation process is an energetic process. As such, the process may lead to formation of point defects or residual damages including dislocations, stackings, and end of range damage. Such defects may also lead to increase in lateral TED of ion-implanted dopants. In addition, lateral TED of ion-implanted dopants may lead to reduction in effective gate length, degradation in overlap capacitance, degradation in threshold voltage ($V_t$), and degradation in drain induced barrier lowering (DIBL) in formed devices 100.

Less defects or damages remain after an anneal process in a substrate 100 that has been processed with low-temperature ion implantation. The substrate 102, instead, experiences an increase in amorphization. Accordingly, the low-temperature ion implantation leads to a reduction in end-of-range damage, which leads to the reduction in lateral TED of ion-implanted dopants. In addition, the device 100 ultimately formed has an increase in effective gate length, an improvement in overlap capacitance, an improvement in threshold voltage ($V_t$), and an improvement in drain induced barrier lowering (DIBL) in formed devices 100.

In addition to the advantages noted above, ion implantation performed at a temperature of 273° K or below decreases external resistance. Low temperature ion implantation leads to a higher degree of amorphization of the substrate 102 and during anneal, the formation of less defects or residual damages. Thus, a higher concentration of the dopants implanted into the substrate may be activated. Those of ordinary skill in the art will recognize that optical or thermal activation process may follow the ion implantation doping process to activate the dopants. Defects and damages formed during conventional ion implantation process may hinder activation of ion-implanted dopants. Accordingly, the substrate 102 implanted with a high dose of dopants may nevertheless have a low concentration of activated dopants. The device 100 may have a low number of carriers and higher resistance. Low temperature ion implantation leads to fewer defects or damages, and a higher concentration of activated dopants. As such, more carriers are available in the device 100 formed via low temperature ion implantation. In addition, the device 100 formed via low temperature ion implantation has a higher $I_{dStat}$ and drive current. Further, the device 100 formed via low temperature ion implantation has lower external resistance.

Further, the junction depth 124 and the length of the source/drain extension 112 may be controlled. For example, as the lateral TED of ion-implanted dopants may be controlled by the low-temperature ion implantation, similarly, the junction depth 124 and the length of the source/drain extension 112 may be precisely controlled. As such, a device 100 with shallower junction may be possible. Junction leakage may be optimized by low-temperature ion implantation.

In addition to the advantages noted above, the low temperature ion implantation enables use of faster forms of annealing which in turn allow higher peak temperature and higher solubility of the dopant for further increases in active dopant concentrations. As noted above, the ion implantation process is an energetic process, which leads to formation of defects and residual damages. Such defects and damages are undesirable as they lead to less than optimal device parametric and degradation in device performance.

Conventionally, defects and damages may be minimized by annealing the substrate after the ion implantation. Various types of annealing process may be used. After implantation, the substrate 102 may be annealed via furnace annealing process or faster annealing processes, such as FLASH anneal, laser anneal or other suitable fast processes. The furnace annealing process, although capable of reducing the concentration of defects and damages, is less desirable due to its long thermal budget and inability to anneal substrates at very high temperatures without inducing significant diffusion on the dopants. Accordingly, manufacturing processes that employ furnace or slower annealing may limit the overall performance of the final device.

Although the faster annealing process may result in much higher active dopant concentrations, these annealing processes are incapable of minimizing the concentration of the defects and damages, which ultimately lowers the performance of the formed devices. Due to the thermal budget and/or time associated with fast annealing processes, these processes are incapable of fully recrystallizing the defects and damages formed during the ion implantation process. Thus, semiconductor manufacturers are currently forced to sacrifice potential active dopant concentration and therefore drive current for leakage induced by residual damage and therefore off current.

Fast annealing can take many forms. The term "fast anneal" is intended to represent any anneal process which operates in less than 5 milliseconds, preferably closer to one millisecond. This time refers to the time from the peak temperature to the time where the temperature has dropped 250° C. or more. In some embodiments, the fast anneal process is performed using a laser. A laser spike anneal (LSA) process uses a laser to heat the substrate. Typically, a set of optics is used to direct and focus the laser to a particular region of the substrate. The laser can emit light at any suitable wavelength.

In other embodiments, a FLASH anneal can be performed. A FLASH anneal may utilize arc lamps, which emit a flash of light, which is used to heat the substrate. The number and intensity of the arc lamps determines the peak temperature of the anneal.

In both cases, the substrate may be maintained at an intermediate temperature, such as about 500° C. to 800° C. The laser or FLASH anneal then rapidly raises the temperature of the substrate, often by several hundred degrees. After the laser or FLASH is completed, the substrate returns to the intermediate temperature.

However, unexpectedly, a low temperature ion implantation process, which enhances amorphization of the substrate and which, upon annealing, results in the formation of fewer defects and damages, enables the use of the faster annealing processes to enhance the activation of implanted dopants. Accordingly, use of the low temperature ion implantation process may enable use of faster annealing processes to simultaneously improve drive current due to fewer residual defects, higher solubility and increased active dopant concentrations while still resulting in minimal residual defects. Minimal residual defects also lowers leakage and therefore decreases off current of the device.

Figure 2:
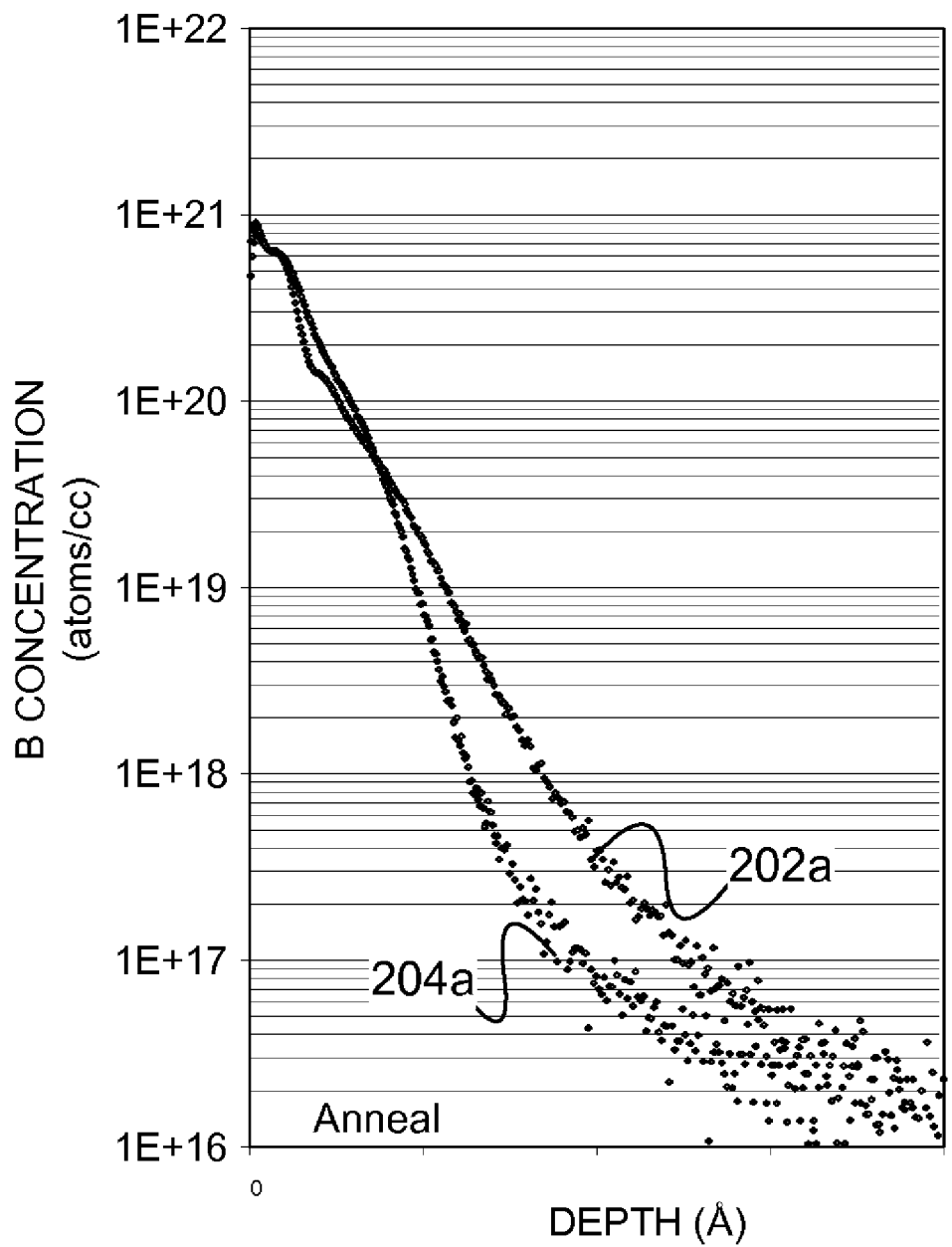
FIG. 2 is a graph comparing boron concentration to depth for two different implant processes.

Referring to FIG. 2, there is shown concentration profile of the dopants, after activation, that were implanted under different substrate temperatures. These were samples that were annealed using FLASH anneal wherein the intermediate temperature was 750° C. and the peak temperature was 1250° C. Referring to the line 202a, a substrate was implanted with p-type dopants (e.g. dopants containing boron), and the substrate was maintained at a temperature above 273° K. Referring to the line 204a, a substrate was implanted with p-type dopants (e.g. dopants containing boron), and the substrate was maintained at a temperature at or below 273° K. The implants were performed under the following conditions. Carbon was implanted at an implant energy of 5 keV and a dosage of 5E14. Boron diflouride ($BF_2$) was implanted at an implant energy of 3 keV and a dosage of 6E14. The low temperature implant resulted in a substrate resistance of 886 ohms/$cm^2$, while the normal implant resulted in a substrate resistance of 1308 ohms/$cm^2$. Furthermore, the concentration of dopants decreases much more quickly as a function of depth when the implant is performed at low temperatures. Therefore, with all conditions being held constant, the low temperature ion implantation process resulted in shallower junction depth and more abrupt dopant concentration profile after activation. In addition, external resistance of the device is decreased with low temperature ion implantation.

Figure 3:
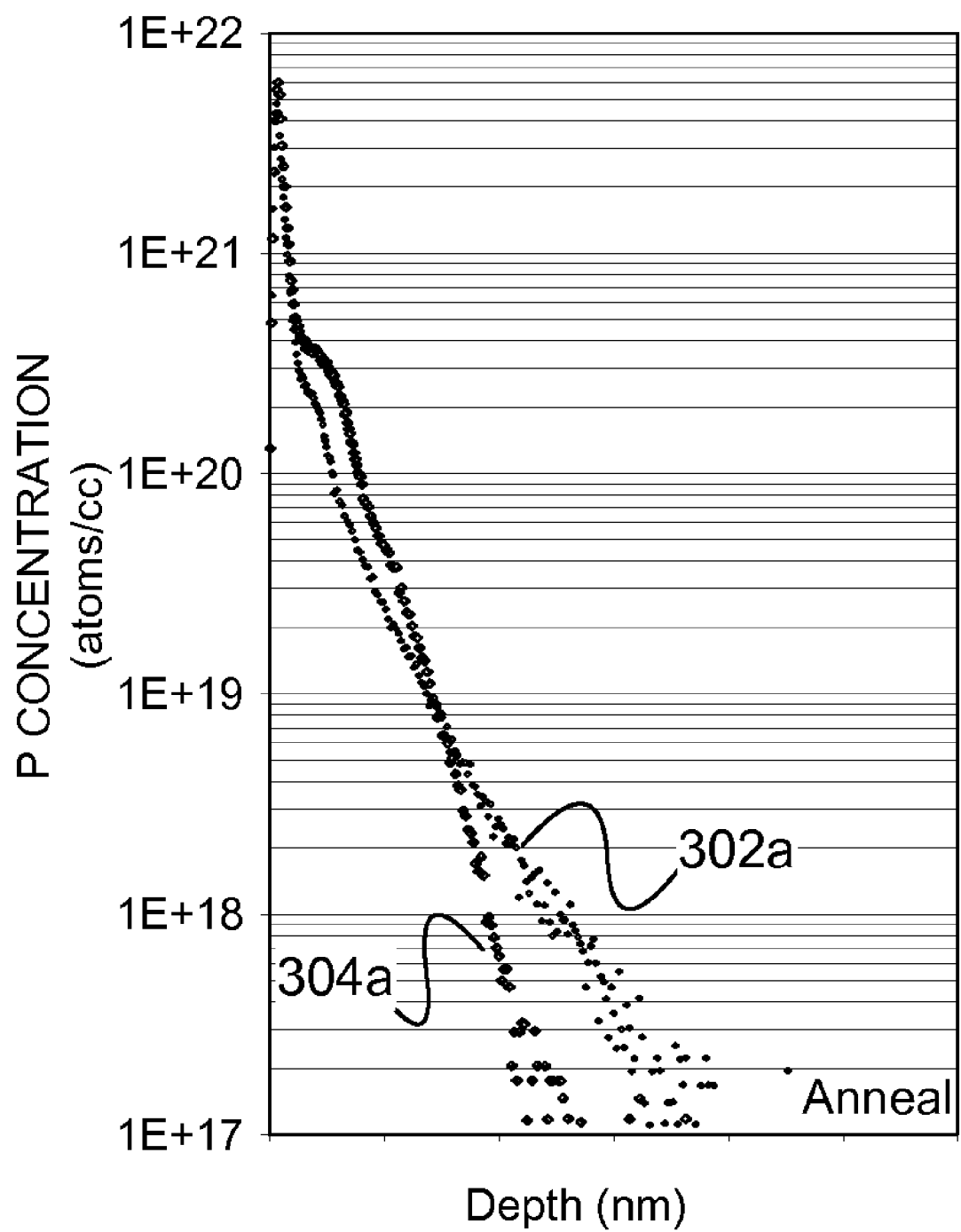
FIG. 3 is a graph comparing phosphorus concentration to depth for two different implant processes.

Referring to FIG. 3, there is shown concentration profile of the dopants, after activation, that were implanted under different substrate temperatures. Referring to the line 302a, a substrate was implanted with n-type dopants (e.g. dopants containing phosphorous), and the substrate was maintained at a temperature above 273° K. Referring to the line 304a, a substrate was implanted with p-type dopants (e.g. dopants containing phosphorous), and the substrate was maintained at a temperature at or below 273° K. The implants were performed under the following conditions. Carbon was implanted at an implant energy of 5 keV and a dosage of 5E14. Phosphorus was implanted at an implant energy of 1 keV and a dosage of 2E15. The low temperature implant resulted in a substrate resistance of 237.7 ohms/$cm^2$, while the normal implant resulted in a substrate resistance of 317.5 ohms/$cm^2$. Therefore, as with FIG. 2, with all conditions being held constant, the low temperature ion implantation process resulted in shallower junction depth and more abrupt dopant concentration profile after activation. In addition, external resistance of the device is decreased with low temperature ion implantation.

Figure 4:
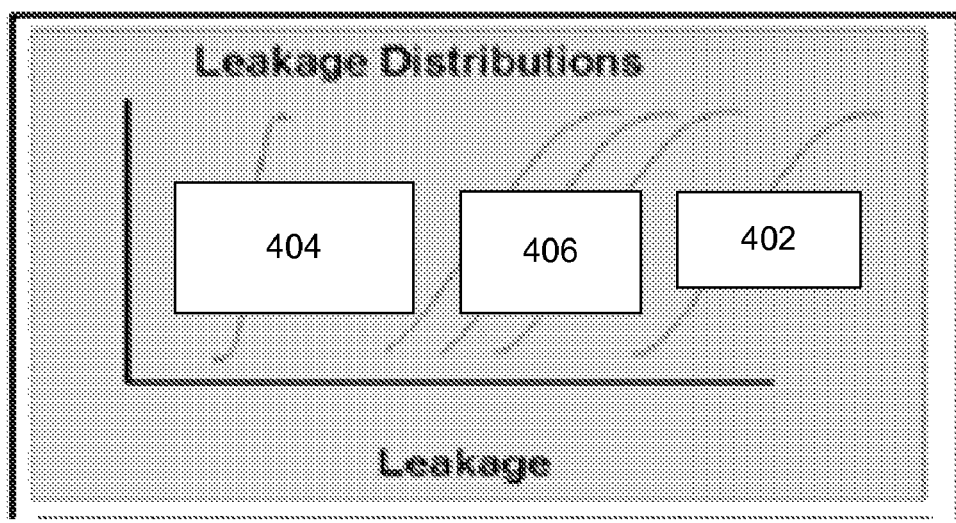
FIG. 4 shows the leakage current distribution for three different implant processes.

Referring to FIG. 4, there is shown junction leakage current distribution of devices formed under different ion implantation conditions. Referring to line 402, the device is formed under a first predetermined condition, and the substrate is maintained at a temperature above 273° K. Referring to line 404, the device is formed under a second predetermined condition, and the substrate is maintained at a temperature below 273° K. Referring to line 406, the device is formed under a third predetermined condition, and the substrate is maintained at a temperature further below 273° K. In these figures, all process conditions are held constant, except for the changes in temperature, thereby showing the effect of temperature on defects and leakage current.

Device formed via low temperature ion implantation result in a substantial improvement in junction leakage current. This improvement can be as great as an order of magnitude or greater.

In the present disclosure, the temperature of the substrate may be maintained at low temperature by a low temperature system which may include the platen. Detailed description of techniques and apparatus for maintaining the substrate at low temperature may be found in U.S. patent application Ser. Nos. 11/770,220, 11/778,335, 11/733,445, 12/366,438, 11/696,506, 12/243,983, 12/244,013, and 12/132,939, each of which is incorporated in its entirety by reference.

Figure 5:
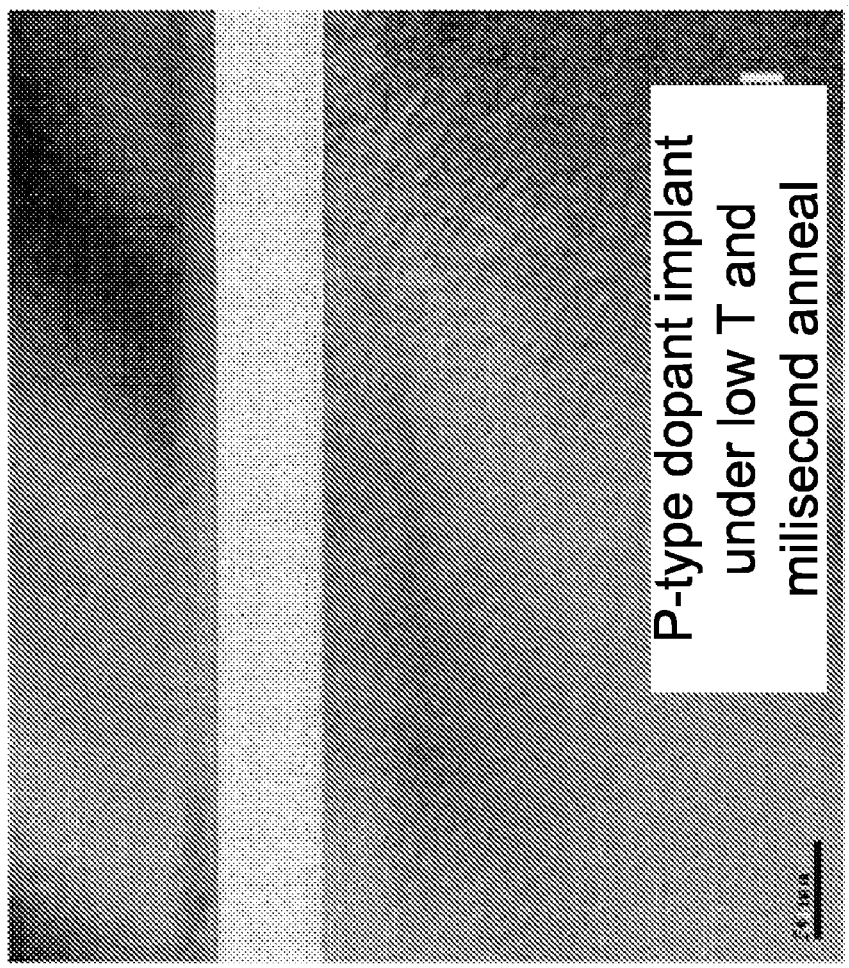
FIG. 5 is a cross-sectional view of substrate following a low temperature implant and laser anneal.

Referring to FIG. 5, there is shown a substrate that was ion implanted under low temperature and annealed using laser annealing process. As shown in the figure, the substrate contains none or minimal amount of end-of-range damages. The smooth lines separating the light colored region from the adjacent regions indicate that damage is minimal. Thus, cold implants enable fast forms of anneal because the enhanced amorphization fully recrystallizes even at these greatly reduced thermal budgets.

In practice, it is anticipated that a region of a substrate is implanted with ionss at a low temperature. This region may be a source region, drain region, pocket or halo implant, or other structure. The implant energy and dose are determined by the device layout and process flow. These ions may be dopants, such as atomic or molecular ions containing Group III and Group V elements. In other embodiments, the ions may be noble gasses or Group IV elements, as the present disclosure is not limited to a particular type of implant. After the implantation is completed, the substrate would be subjected to fast annealing. As described above, this fast anneal process may be laser anneal, FLASH anneal, or any other suitable anneal cycle. This fast anneal cycle recrystallizes the regions that has been amorphized by the implant, reducing the residual defects. Other semiconductor process steps may also be included in the process.

In the present disclosure, several techniques for optimizing device are disclosed. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a substrate, comprising:
   implanting ions into a portion of said substrate at low temperature; and
   performing a fast form of anneal to recrystallize the implanted portion of said substrate, wherein said low temperature is between 173° K and 273° K.

2. The method of claim 1, wherein said fast form of anneal comprises laser spike anneal.

3. The method of claim 1, wherein said fast form of anneal comprises FLASH anneal.

4. The method of claim 1, wherein said portion of said substrate comprises a drain or source region.

5. The method of claim 4, wherein said ions comprises dopants.

6. The method of claim 5, wherein said dopants comprise atomic or molecular ions comprising Group III or Group V elements.

7. The method of claim 1, wherein said substrate is exposed to a peak temperature for less than 5 milliseconds.

8. The method of claim 7, wherein said substrate is exposed to a peak temperature for less than 1 millisecond.

9. A method of processing a substrate, comprising:
   implanting ions into a portion of said substrate at low temperature; and
   performing a laser anneal to recrystallize the implanted portion of said substrate, wherein said low temperature is between 173° K and 273° K.

10. The method of claim 9, wherein said portion of said substrate comprises a drain or source region.

11. The method of claim 10, wherein said ions comprises dopants.

12. The method of claim 11, wherein said dopants comprise atomic or molecular ions comprising Group III or Group V elements.

* * * * *